United States Patent
Itami et al.

(10) Patent No.: US 8,039,741 B2
(45) Date of Patent: *Oct. 18, 2011

(54) PHOTOELECTRIC CONVERSION ELEMENT AND SOLAR CELL

(75) Inventors: Akihiko Itami, Tokyo (JP); Fumitaka Mochizuki, Tokyo (JP); Kazukuni Nishimura, Tokyo (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 410 days.

This patent is subject to a terminal disclaimer.

(21) Appl. No.: 11/873,434

(22) Filed: Oct. 17, 2007

(65) Prior Publication Data

US 2008/0173346 A1    Jul. 24, 2008

(30) Foreign Application Priority Data

Dec. 8, 2006  (JP) .................................. 2006-331695
Feb. 20, 2007 (JP) .................................. 2007-039122

(51) Int. Cl.
  *H01L 31/00* (2006.01)

(52) U.S. Cl. ...................................... 136/263; 136/252

(58) Field of Classification Search .................. 136/252, 136/263
See application file for complete search history.

(56) References Cited

U.S. PATENT DOCUMENTS

2006/0237059 A1 * 10/2006 Kurihara et al. .............. 136/263

FOREIGN PATENT DOCUMENTS

JP   2005123033   * 5/2005
JP   2007013115   * 1/2007
WO  WO2004102724  * 11/2004

OTHER PUBLICATIONS

Machine transaltion of JP2005123033, pub. May 2005.*
Machine translation of JP2007013115, pub. Jan. 2007.*

(Continued)

*Primary Examiner* — Basia Ridley
*Assistant Examiner* — Allison Bourke
(74) *Attorney, Agent, or Firm* — Lucas & Mercanti, LLP

(57) ABSTRACT

A photoelectric conversion element comprising a pair of electrodes containing therebetween a compound represented by Formula (1) or Formula (2):

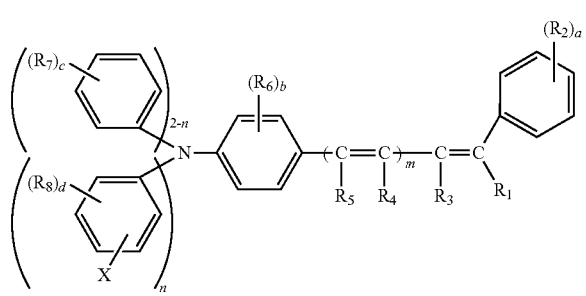

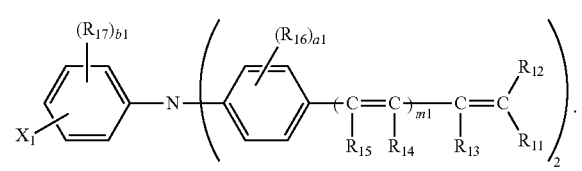

19 Claims, 1 Drawing Sheet

OTHER PUBLICATIONS

Kim et al., "Molecular engineering of organic dyes containing N-aryl carbazole moiety for solar cell." Tetrahedron 63 (2007) 1913-1922.*

Bowerman et al. "EH&S Analysis of Dye-Sensitized Photovoltaic Solar Cell Production." BNL-52640 Formal Report. Brookhaven National Laboratory, Oct. 2001 <http://www.bnl.gov/isd/documents/23176.pdf>.*

Maciel, G.S., et al. "Linear and nonlinear optical properties of an erbium two-photon dye salt," J. Phys. Chem. B, 105, p. 3155-3157, 2001.*

* cited by examiner

PHOTOELECTRIC CONVERSION ELEMENT AND SOLAR CELL

FIELD OF THE INVENTION

The present invention relates to a photoelectric conversion element, specifically to a compound sensitized photoelectric conversion element, and a solar cell utilizing the photoelectric conversion element.

BACKGROUND OF THE INVENTION

In recent years, extensive studies have been made to utilize the sunlight which is unlimited and generates no toxic substances. Examples of the practical application of sunlight which is a clean energy source, at present, include inorganic solar cells for a residential application such as single crystalline silicon, polycrystalline silicon, amorphous silicon, cadmium telluride and indium-copper selenide.

However, one of the disadvantages of these inorganic solar cells is that, for example, in the case of a silicon solar cell, very high purity silicon is required, in which, naturally, the purification process is complicated and numerous processes are included, resulting in a high manufacturing cost.

On the other hand, many solar cells utilizing an organic material have also been proposed. Examples of an organic solar cell include: (i) a Schottky-type photoelectric conversion element in which a p-type organic semiconductor and a metal having a small work function are connected; and (ii) a hetero-connection type photoelectric conversion element, in which a p-type organic semiconductor and an n-type inorganic semiconductor are connected or a p-type organic semiconductor and an electron accepting organic compound are connected. Organic semiconductors utilized in such an organic solar cell include, for example, a synthetic dye or a pigment such as chlorophyll and perylene; and a conductive polymer material such as polyacetylene, and complex materials thereof. These materials are made into thin film, by such as a vacuum evaporation method, a casting method or a dipping method, which constitutes a battery material. The organic material has advantages, for example, a low cost and easy application to a larger area; however, there are also problems, for example, conversion efficiency as low as not more than 1% in many materials; and poor durability.

In such a situation, a solar cell exhibiting excellent characteristics has been reported by Dr. Gratzel et al., Switzerland (for example, refer to Non-Patent Document 1). The proposed cell is a compound sensitized solar cell, and is a wet type solar cell utilizing titanium oxide porous thin film, which is spectrally sensitized by a ruthenium complex, as a working electrode. Advantages of this method are that (i) a low priced oxide semiconductor such as titanium oxide can be used and the purification up to a high purity of this material is not required, resulting in attaining a low cost; and that (ii) usable light covers a broad visible light region, which enables efficient conversion of sunlight to electricity, since sunlight is rich in a visible light component.

On the contrary, since a ruthenium complex having a resource limitation is utilized, supply of a ruthenium complex is uncertain when this solar cell is utilized in practice. Further, this ruthenium complex is expensive and has a problem of stability in aging, however, this problem will be overcome if the material can be changed into a low priced and stable organic compound.

It has been disclosed that an element having high photoelectric conversion efficiency can be obtained when a compound having a triphenylamine structure is utilized (for example, refer to Patent Document 1). However, it has been found that these compounds have problems, for example, a relatively low adsorptive property to titanium oxide, not very high sensitizing effect and not fully sufficient durability.

Patent Document 1 Japanese Patent Application Publication Open to Public Inspection No. (hereinafter, referred to as JP-A No.) 2005-123033

Non-Patent Document 1 B. O'Regan and M. Gratzel, Nature, 353, 737

SUMMARY OF THE INVENTION

An object of the present invention is to provide a sensitizing compound exhibiting a high photoelectric conversion efficiency and high durability, a photoelectric conversion element exhibiting a high photoelectric conversion efficiency, and a solar cell using the photoelectric conversion element.

One of the aspects to achieve the above object of the present invention is a photoelectric conversion element comprising a pair of electrodes containing therebetween a compound represented by Formula (1) or Formula (2):

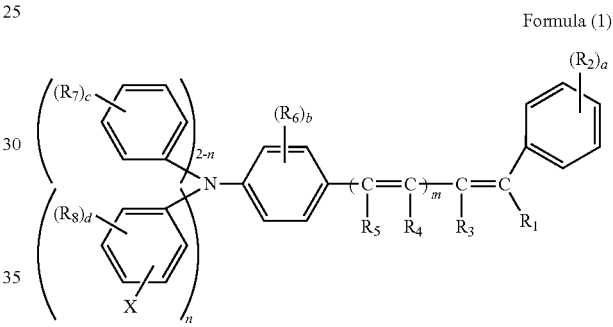

Formula (1)

wherein $R_1$, $R_3$, $R_4$, and $R_5$ each represent a hydrogen atom, a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group or a substituted or unsubstituted heterocycle group;

$R_2$, $R_6$, $R_7$ and $R_8$ each represent a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group, or a substituted or unsubstituted heterocycle group;

$R_1$ may be combined with a neighboring group to form a ring;

$R_7$ and $R_8$ may be combined to form a ring;

X represents an organic group having an acid group;

a and c each represent an integer of 0 to 5;

b and d each represent an integer of 0 to 4;

m represents an integer of 0 to 4;

n represents an integer of 1 or 2;

when $R_1$ is a phenyl group, (a+b+c+d) is 1 or more, or one of $R_3$, $R_4$ and $R_5$ is a group other than a hydrogen atom; and when a plurality of $R_1$, $R_2$, $R_3$, $R_4$, $R_5$, $R_6$, $R_7$ or $R_8$ are contained, the plurality of $R_1$, $R_2$, $R_3$, $R_4$, $R_5$, $R_6$, $R_7$ or $R_8$ may be the same or different,

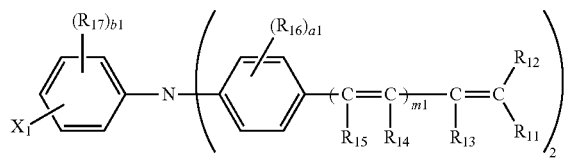

Formula (2)

Wherein $R_{11}$ to $R_{17}$ each represent a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group or a substituted or unsubstituted heterocycle group;

$R_{11}$ and $R_{12}$ may be combined to form a ring;

$X_1$ represents an organic group having an acid group;

A1, b1 and m1 each represent an integer of 0 to 4; and when a plurality of $R_{11}$, $R_{12}$, $R_{13}$, $R_{14}$, $R_{15}$, $R_{16}$, or $R_{17}$ are contained, the plurality of $R_{11}$, $R_{12}$, $R_{13}$, $R_{14}$, $R_{15}$, $R_{16}$, or $R_{17}$ may be the same or different.

DESCRIPTION OF THE PREFERRED EMBODIMENTS

Figure 1:
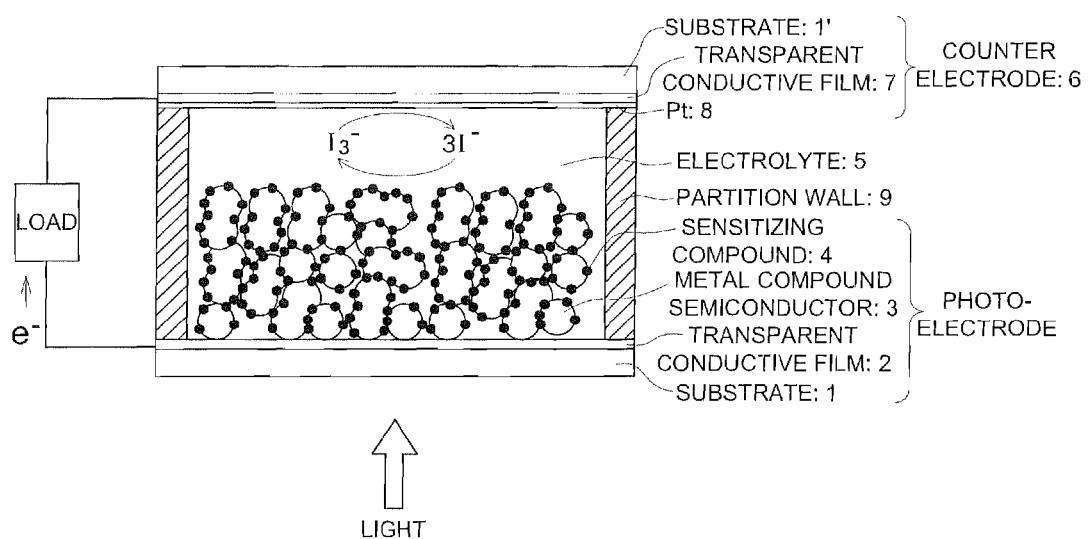
FIG. 1 is a structural cross-section view illustrating an example of the photoelectric conversion element of the present invention.

According to the present invention, a compound sensitized photoelectric conversion element exhibiting a high photoelectric conversion efficiency and high durability, and a solar cell using the photoelectric conversion element can be provided.

In the following, the present invention will be detailed.

The photoelectric conversion element of the present invention will now be explained using a figure.

FIG. 1 is a structural cross-section view illustrating an example of the photoelectric conversion element of the present invention.

As shown in FIG. 1, the photoelectric conversion element contains substrates 1 and 1', transparent conductive films 2 and 7, metallic compound semiconductor 3, sensitizing compound 4, electrolyte 5 and partition wall 9.

As a photo-electrode, utilized is substrate 1 provided with transparent conductive film 2 (also referred to as a conductive substrate) having thereon a porous semiconductor layer formed by sintering particles of metal compound semiconductor 3, followed by adsorbing sensitizing compound 4 on the surfaces of the pores in the semiconductor layer.

As counter electrode 6, utilized is substrate 1' provided with transparent conductive film 7, followed by vacuum evaporating Pt 8 on the transparent conductive film 7. Electrolyte 5 is filled between the pair of electrodes.

The present invention relates to the new sensitizing compound used for this photoelectric conversion element.

Since the sensitizing compound generates current by repeating a photo-oxidation reaction at the time of power generation, a compound having a strong resistance to oxidation is desired for improving the durability of the photoelectric conversion element. Accordingly, in the present invention, styryltriphenylamine exhibiting high durability against ozone which is a strong oxidizing agent is employed as a central moiety of the sensitizing compound, and a chelate bonding with titanium oxide is made possible by addition of an acid group, which enables efficient transfer of an photo-excited electron to titanium oxide. Further, to increase transfer efficiency of a photo-excited electron, a styryltriphenylamine central moiety and an acid group are connected by an electron attracting π conjugated bond.

The sensitizing compound having styryltriphenylamine as a central moiety exhibits excellent efficiency or durability, however, it was found that, when the molecular size becomes large, the compatibility of the compound to a solvent is lowered. When the compatibility to a solvent is lowered, the amount of the compound adsorbed to titanium oxide is limited, resulting in lowering the photoelectric conversion efficiency. In order to overcome this problem, it was found in the present invention that the compatibility of the compound to a solvent can be improved by introducing a group other than a hydrogen atom to the styryl-triphenylamine central moiety in order to lower the symmetry of the molecule.

In the following, the sensitizing compound represented by Formula (1) or (2) (hereafter, also referred to as the compound of the present invention) will be explained.

In Formula (1), $R_1$, $R_3$, $R_4$, and $R_5$ each represent a hydrogen atom, a halogen atom (for example, a fluorine atom, a chlorine atom and a bromine atom), a substituted or unsubstituted alkyl group (for example, a methyl group, an ethyl group, a t-butyl group, an isobutyl group, a dodecyl group, a hydroxyethyl group and a methoxyethyl group), a substituted or unsubstituted alkoxy group (for example, a methoxy group), a substituted or unsubstituted aryl group (for example, a phenyl group and a tolyl group), a substituted or unsubstituted alkenyl group (for example, an allyl group), a substituted or unsubstituted amino group (for example, a dimethylamino group) or a substituted or unsubstituted heterocycle group (for example, a morphonyl group and a furanyl.

$R_2$, $R_6$, $R_7$ and $R_8$ each represent a halogen atom (for example, a fluorine atom, a chlorine atom and a bromine atom), a substituted or unsubstituted alkyl group (for example, a methyl group, an ethyl group, a t-butyl group, an isobutyl group, a dodecyl group, a hydroxyethyl group and a methoxyethyl group), a substituted or unsubstituted alkoxy group (for example, a methoxy group), a substituted or unsubstituted aryl group (for example, a phenyl group and a tolyl group), a substituted or unsubstituted alkenyl group (for example, an allyl group), a substituted or unsubstituted amino group (for example, a dimethylamino group) or a substituted or unsubstituted heterocycle group (for example, a morphonyl group and a furanyl.

$R_1$ may be combined with a neighboring group to form a ring, and $R_7$ and $R_8$ may be combined to form a ring. The linkage group combining $R_7$ and $R_8$ is preferably a single bond or a methylene group.

However, when $R_1$ is a phenyl group, (a+b+c+d) is 1 or more, or one of $R_3$, $R_4$ and $R_5$ is a group other than a hydrogen atom. The group other than a hydrogen atom is preferably an alkyl group, an alkoxy group or an aryl group.

X represents an organic group having an acid group. Examples of the acid group include a carboxyl group, a phosphonyl group and a sulfonyl group, and examples of an organic group include an alkylene group, an alkenylene group, an arylene group and a heterocycle group. Examples of an organic group having a preferable acid group include -alkylene-COOH, -arylene-COOH, -alkylene-PO(OH)$_2$, —CH=C(CN)COOH, -heterocycle-alkylene-COOH, —CH=heterocycle-alkylene-COOH. When a plurality of $R_1$, $R_2$, $R_3$, $R_4$, $R_5$, $R_6$, $R_7$ or $R_8$ are contained, the plurality of $R_1$, $R_2$, $R_3$, $R_4$, $R_5$, $R_6$, $R_7$ or $R_8$ may be the same or different.

In Formula (2), the groups represented by $R_{11}$-$R_{17}$ are the same as the groups represented by $R_1$-$R_8$ in Formula (1) and $X_1$ is the same as X in Formula (1). When a plurality of $R_1$, $R_2$, $R_3$, $R_4$, $R_5$, $R_6$, $R_7$ or $R_8$ are contained, the plurality of $R_1$, $R_2$, $R_3$, $R_4$, $R_5$, $R_6$, $R_7$ or $R_8$ may be the same or different. $R_{11}$ and $R_{12}$ may be combined each other to form a ring.

Example of the sensitizing compound of the present invention will be shown below, however, the present invention is not limited thereto.

Examples of a compound represented by Formula (1):

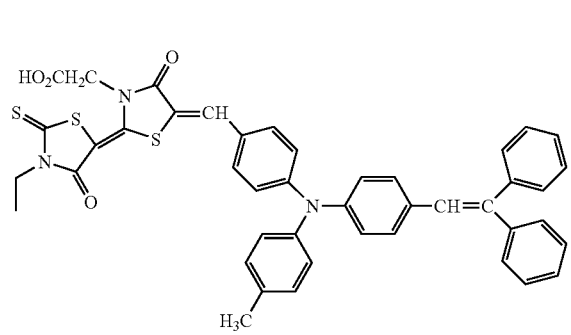

I-1

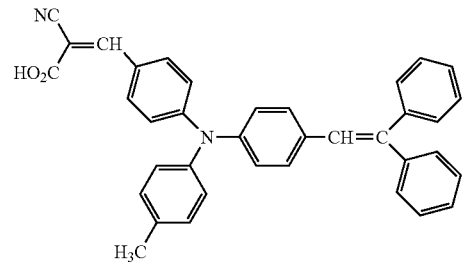

I-2

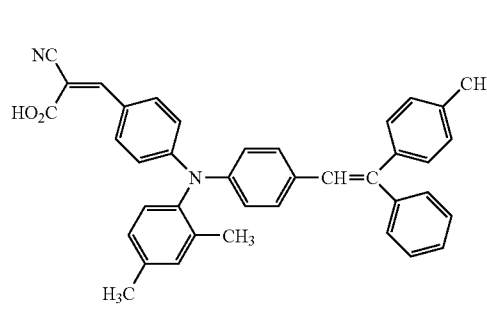

I-3

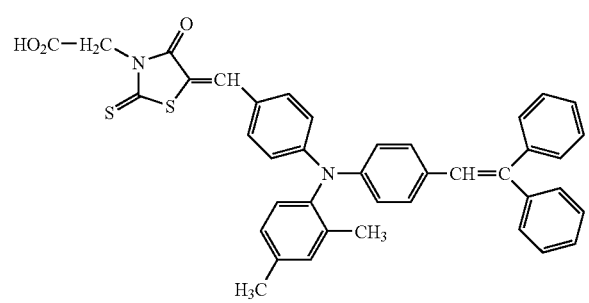

I-4

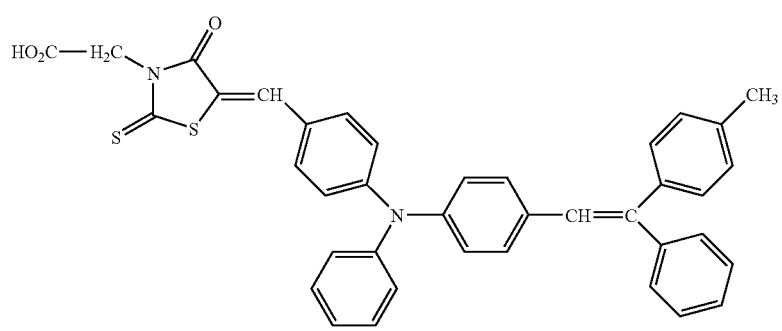

I-5

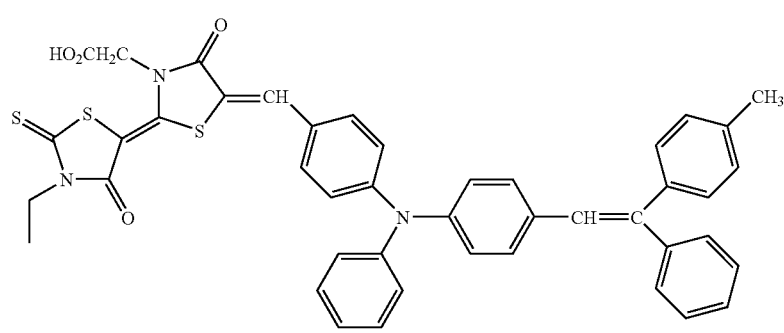

I-6

I-7
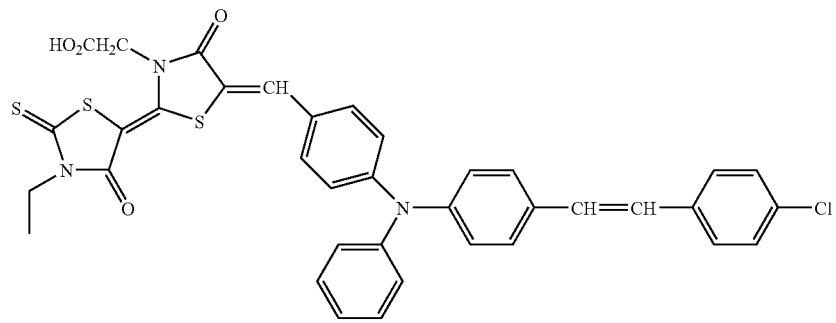
I-8
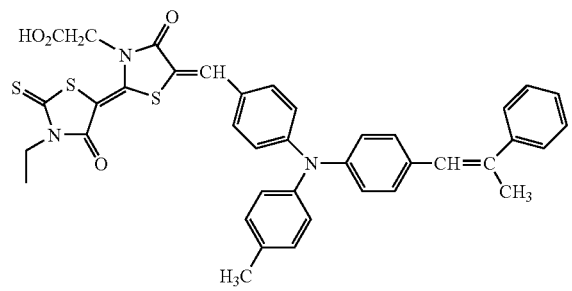
I-9
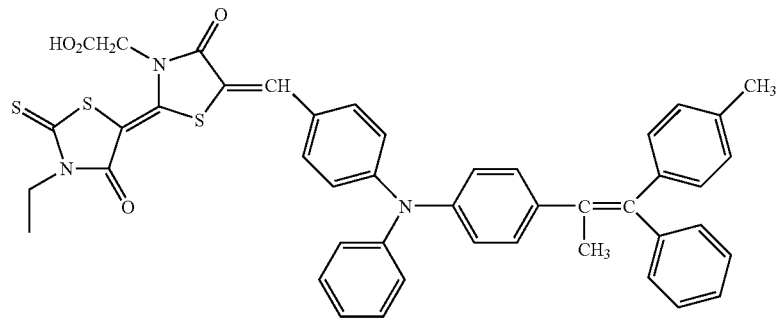
I-10
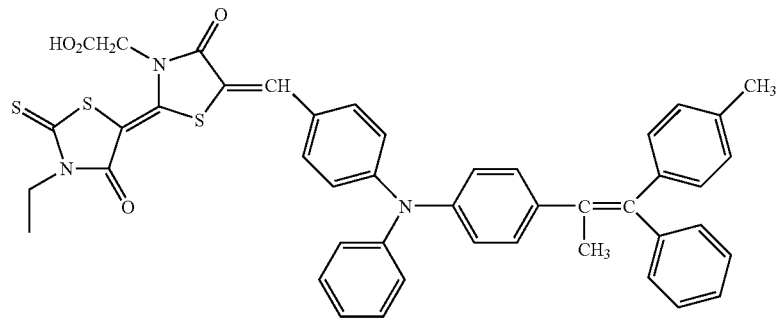
I-11
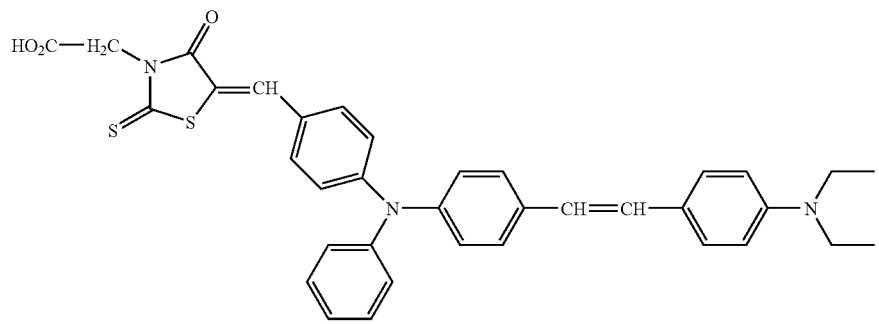
I-12
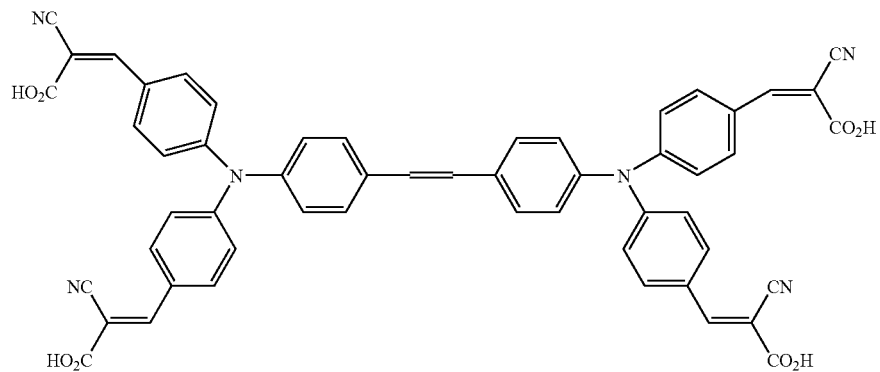

-continued
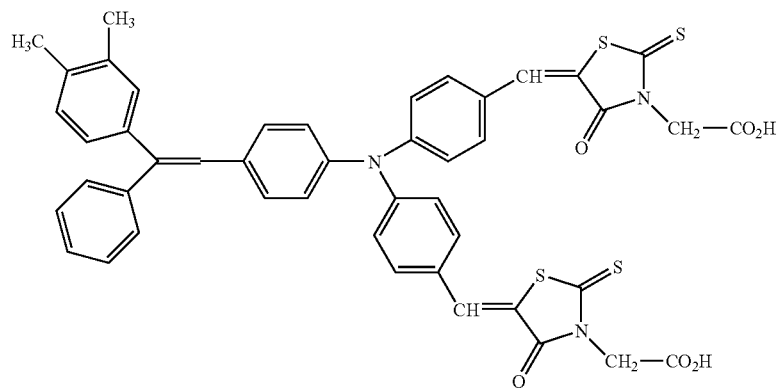
I-13
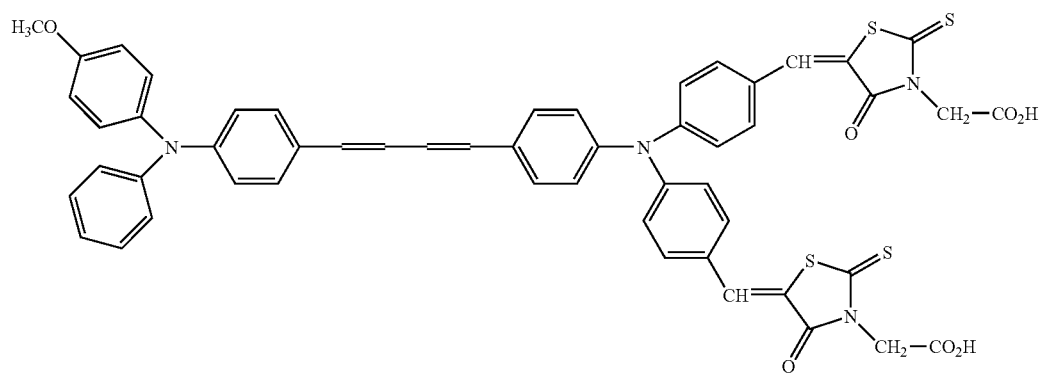
I-14
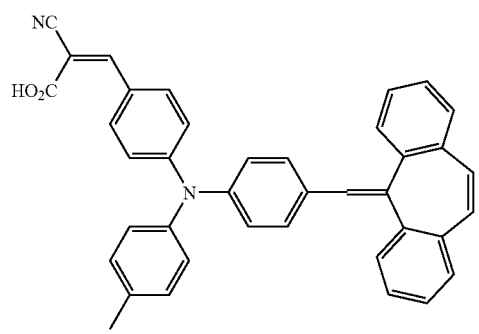
I-15
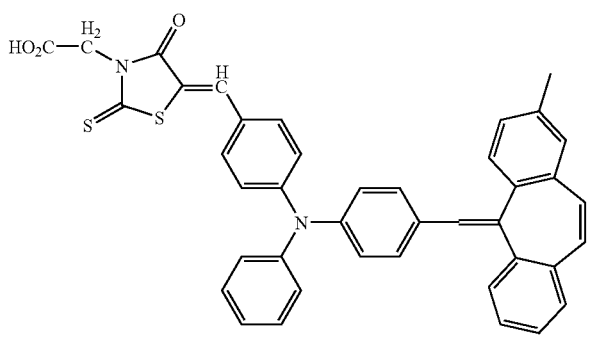
I-16
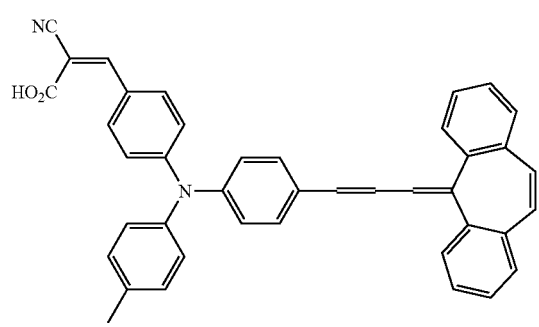
I-17
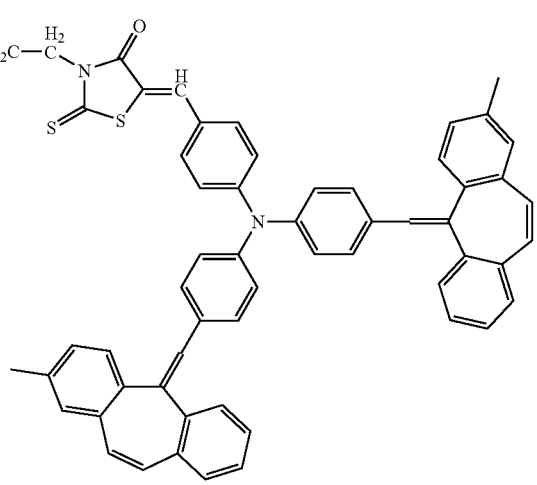
I-18

I-19
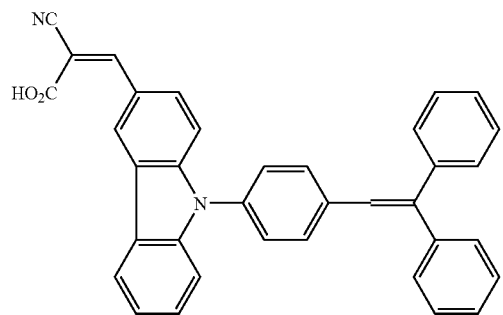
Examples of a compound represented by Formula (2):
II-1
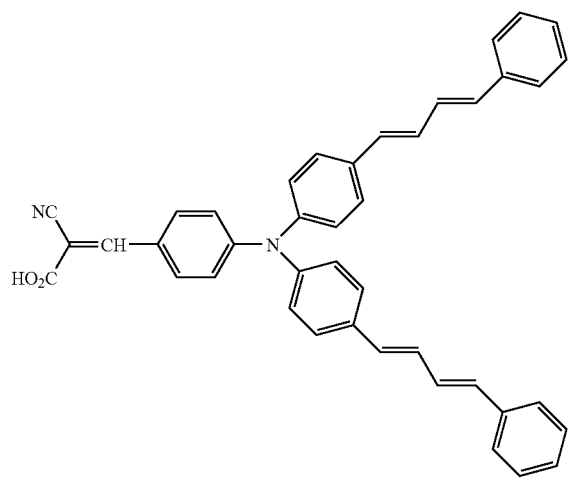
II-2
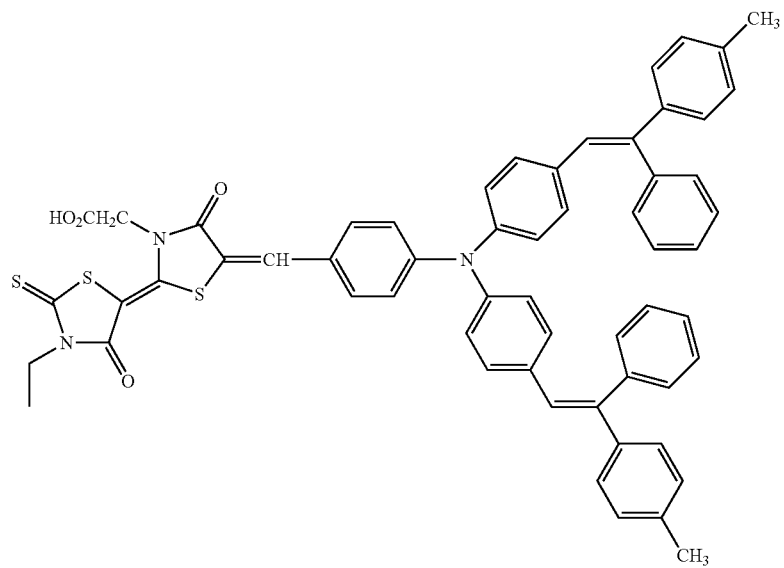

-continued

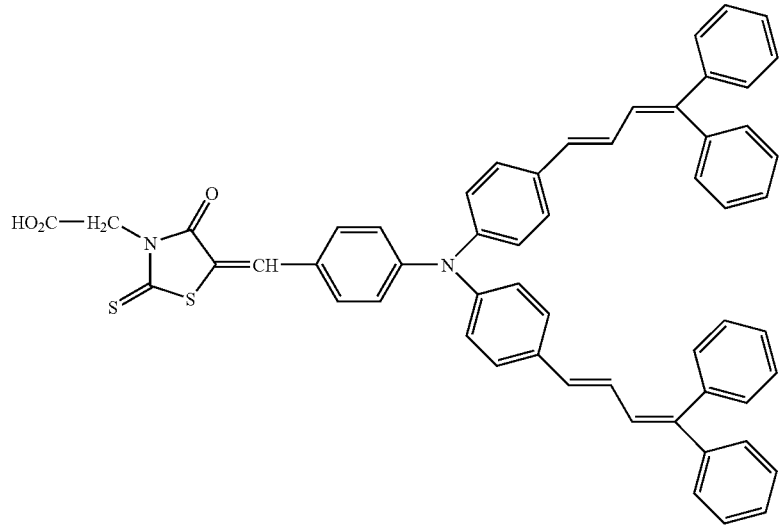

II-3

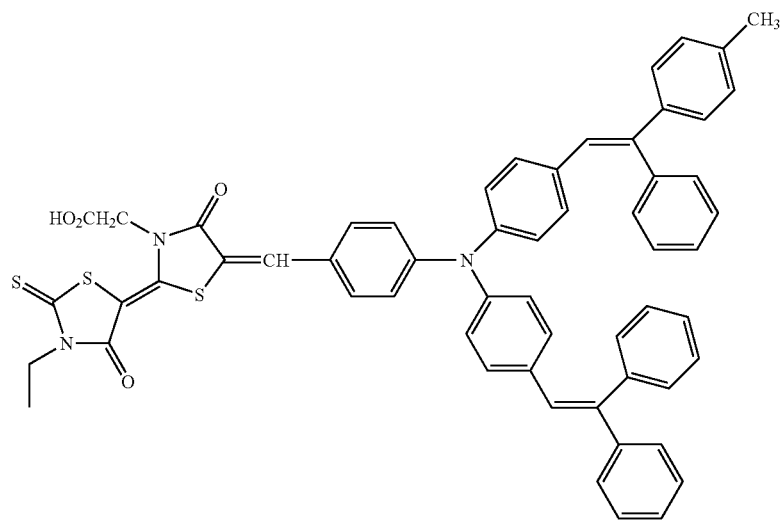

II-4

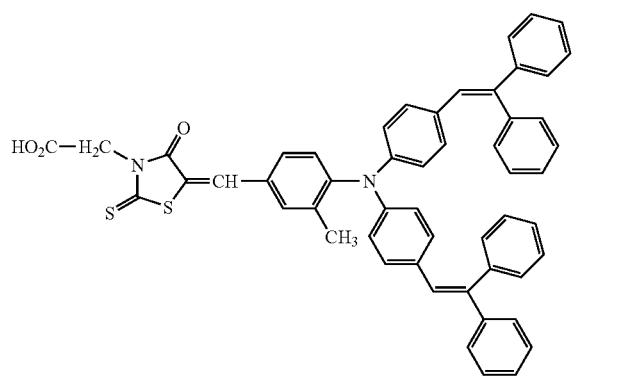

II-5

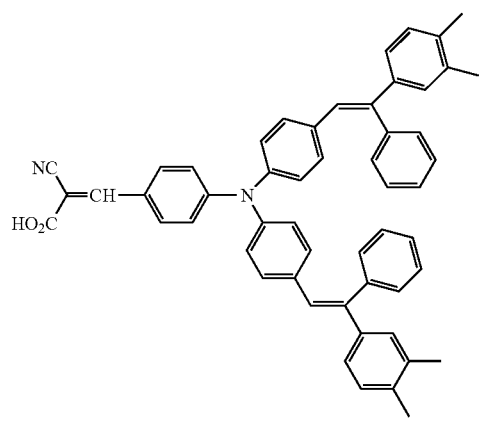

II-6

The sensitizing compound of the present invention can be prepared by a common synthesizing method. In the following, an example of a synthesizing method will be shown.
[Synthesis of Exemplified Compound I-2]

To one equivalent of α-phenyl-4-N-(4-methylphenyl)-N-phenylaminostilbene, 3 equivalents of phosphorus oxychloride and 4 equivalents of N,N'-dimethylformamide were added, and the mixture was heated at 60° C. for 8 hours under a nitrogen atmosphere to obtain a monoformylated compound. A mixture of one quivalent of the above monoformylated compound, 1.2 equivalents of cyanoacetic acid and an acetic acid solution of 2.2 equivalents of ammonium acetate was heat fluxed for one hour to obtain the compound (exemplified compound I-2).

Other compounds can be synthesized in a similar manner.

The metal compound semiconductor of the present invention is sensitized by incorporating a thus obtained compound and enables to exhibit the effects described in the present invention. Incorporating the sensitizing compound in the metal compound semiconductor includes various embodiments such as adsorption of the compound on the semiconductor surface, and, when a semiconductor is provided with a porous structure, filling the sensitizing compound in the porous structure of the semiconductor.

Further, the total content of the compound of the present invention per 1 $m^2$ of the semiconductor layer is preferably in a range of 0.01-100 mmol, more preferably 0.1-50 mmol and specifically preferably 0.5-20 mmol.

In the case of performing a sensitization treatment by use of the sensitizing compound of the present invention, the aforesaid compound may be utilized alone; or a plurality of compounds may be utilized in combination. Further, other compound (for example, compound described in such as U.S. Pat. Nos. 4,684,537, 4,927,721, 5,084,365, 5,350,644, 5,463,057 and 5,525,440; and JP-A Nos. 7-249790 and 2000-150007) may be utilized in combination.

In particular, in the case that application of the photoelectric conversion element of the present invention is a solar cell, which will be described below, it is preferable to utilize at least two kinds of compounds having different absorption wavelengths in combination so as to make a wavelength region of photoelectric conversion as broad as possible to effectively utilize sunlight.

To incorporate a sensitizing compound of the present invention in a metal compound semiconductor, an ordinary method is to dissolve the aforesaid compound in a suitable solvent (such as ethanol) and to immerse a semiconductor having been well dried in said solution for a long time.

In the case of performing a sensitization treatment utilizing (i) a plurality of sensitizing compounds of the present invention together or (ii) said compound and another sensitizing compound in combination, it can be performed by preparing a mixed solution of each compound, or by preparing a solution of each compound and successively immersing the semiconductor in each solution. In the case of manufacturing by preparation of a separate solution of each compound and successive immersion in each solution, the effects of the present invention can be obtained despite of the order of incorporation of the aforesaid sensitizing compound or other sensitizing compound in a metal compound semiconductor. Further, it is also possible, for example, to mix plural kinds of semiconductor particles, each kind containing only one of the above described compounds to prepare the metal compound semiconductor electrode.

Details of the sensitization treatment of the metal compound semiconductor will be specifically explained in an explanation of a photoelectric conversion element which will be described later.

In the case of a metal compound semiconductor having high porosity, it is preferable to complete an adsorption treatment of the sensitizing compound before water or water vapor adsorbs on the semiconductor surface or in the voids of the interior of semiconductor thin film.

Next, the photoelectric conversion element of the present invention will be explained.

[Photoelectric Conversion Element]

The photoelectric conversion element contains a photo-electrode in which a compound is adsorbed on a metal compound semiconductor formed on a conductive electrode, and a counter electrode which is facing the photo-electrode through an electrolyte layer. In the following, the metal compound semiconductor, the photo-electrode, the electrolyte and the counter electrode will be subsequently explained.

<Metal Compound Semiconductor>

Examples of a metal compound semiconductor utilized for the photo-electrode include: elemental substances such as silicon and germanium; compounds containing an element of Groups 3-5 and Groups 13-15 of the periodic table (also referred to as the element periodic table); metal chalcogenides (such as oxides, sulfides and selenides); and metal nitrides.

Examples of a metal chalcogenide include: oxides of titanium, tin, zinc, iron, tungsten, zirconium, hafnium, strontium, indium, cerium, yttrium, lanthanum, vanadium, niobium or tantalum; sulfides of cadmium, zinc, lead, silver, antimony and bismuth; selenides of cadmium and lead; a telluride of cadmium. Examples of other metal compound semiconductor include: phosphides of zinc, gallium, indium and cadmium; selenides of gallium-arsenic and copper-indium; and a sulfide of copper-indium and a nitride of titanium.

Specific examples of the abovementioned compound include: $TiO_2$, $SnO_2$, $Fe_2O_3$, $WO_3$, $ZnO$, $Nb_2O_5$, $CdS$, $ZnS$, $PbS$, $Bi_2S_3$, $CdSe$, $CdTe$, $GaP$, $InP$, $GaAs$, $CuInS_2$, $CuInSe_2$ and $Ti_3N_4$. Of these, preferably utilized are $TiO_2$, $ZnO$, $SnO_2$, $Fe_2O_3$, $WO_3$, $Nb_2O_5$, $CdS$ and $PbS$; more preferably utilized are $TiO_2$ and $Nb_2O_5$; and most preferably utilized is $TiO_2$.

In the metal compound semiconductor electrode of the present invention, the above-described plural semiconductors may be utilized in combination. For example, a few types of the above described metal oxides or metal sulfides may be utilized in combination, or utilized may be a titanium oxide semiconductor mixed with 20 mass % of titanium nitride ($Ti_3N_4$). Further, zinc oxide/tin oxide complex, described in J. Chem. Soc., Chem. Commun., 15 (1999), may also be utilized. In the case when a component other than a metal oxide and a metal sulfide is added in the semiconductor, the mass ratio of the additional component to a metal oxide or a metal sulfide semiconductor is preferably not more than 30%.

A metal compound semiconductor of the present invention may be subjected to a surface treatment by use of an organic base. The aforesaid organic base includes, for example, diarylamine, triarylamine, pyridine, 4-t-butylpyridine, polyvinyl pyridine, quinoline, piperidine and amidine, however, preferable among them are pyridine, 4-t-butylpyridine and polyvinyl pyridine.

The surface treatment can be carried out by using the aforesaid organic base as it is when it is a liquid, or by preparing a solution of an organic base dissolved in an organic solvent when it is a solid, and by immersing a metal compound semiconductor of the present invention in liquid amine or in an amine solution.

(Electrically Conductive Support)

As an electrically conductive support (also referred to as merely a conductive support) utilized for the photoelectric conversion element of the present invention and the solar cell of the present invention, utilized are those having a structure comprising a conductive substance arranged on a non-conductive material such as a glass plate or a plastic film. Examples of a material utilized for a conductive support include a metal (such as platinum, gold, silver, copper, aluminum, rhodium and indium), a conductive metal oxide (such as an indium-tin complexing oxide and tin oxide doped with fluorine) or carbon. Thickness of a conductive support is not specifically limited, however, is preferably 0.3-5 mm.

The conductive support is preferably substantially transparent. To be essentially transparent means to have a transmittance of not less than 10%, more preferably of not less than 50% and most preferably of not less than 80%. To obtain a transparent support, it is preferable to provide a conductive layer comprising a conductive metal oxide on the surface of a glass plate or a plastic film. In the case of utilizing a transparent conductive support, light is preferably incident from the support side.

Surface resistance of a conductive support is preferably not more than 50 Ω/sq and more preferably not more than 10 Ω/sq.

<<Manufacturing of Photo-electrode>>

The method of manufacturing the photo-electrode of the present invention will be explained.

When the metal compound semiconductor of the photo-electrode of the present invention is in the form of particles, a metal compound semiconductor electrode is preferably prepared by coating or spraying an metal compound semiconductor on a conductive support. Further, when the metal compound semiconductor of the present invention is a film which is not held on a conductive support, the metal compound semiconductor electrode film is preferably pasted on a conductive support to prepare a metal compound semiconductor electrode.

An embodiment of an metal compound semiconductor electrode of the present invention includes a method to form the above-described metal compound semiconductor on a conductive support by calcination.

In the case of preparing an metal compound semiconductor of the present invention by calcination, a sensitizing treatment of said semiconductor utilizing the a sensitizing compound (such as adsorption and filling into a porous layer) is preferably performed after calcination. After calcination, it is preferable to quickly perform an adsorption treatment of the compound before water adsorbs on a semiconductor.

In the following, a method preferably utilized in the present invention to form a photo-electrode by calcination using metal compound semiconductor particles will be explained in detail.

(Preparation of Coating Liquid Containing Metal Compound Semiconductor Particles)

First a coating liquid containing particles of an metal compound semiconductor is prepared. The primary particle diameter of this semiconductor particles is preferably smaller; the primary particle diameter is preferably 1-5,000 nm and more preferably 2-50 nm. A coating liquid containing semiconductor particles can be prepared by dispersing semiconductor particles in a solvent. Semiconductor particles dispersed in a solvent is dispersed in a state of the primary particle. Any solvent is usable as far as it can disperse the particles, and the solvent is not specifically limited.

The aforesaid solvent includes, for example, water, an organic solvent and a mixed solution of water and an organic solvent. As an organic solvent, an alcohol such as methanol or ethanol; a ketone such as methyl ethyl ketone, acetone or acetyl acetone; and a hydrocarbon such as hexane or cyclohexane are usable. In a coating liquid, a surfactant or a viscosity controlling agent (for example, a polyalcohol such as polyethylene glycol) can be appropriately incorporated. A range of concentration of semiconductor particles in a solvent is preferably 0.1-70% by mass and more preferably 0.1-30% by mass.

(Application of Coating Liquid Containing Semiconductor Particles and Calcination Treatment of Formed Semiconductor Layer)

A coating liquid containing semiconductor particles prepared in the above manner is coated or sprayed on a conductive support, followed by being dried, and is calcinated in air or in inert gas, whereby a semiconductor layer (semiconductor film) is formed on a conductive support.

The film prepared by coating and drying the coating liquid on a conductive support is comprised of aggregate of semiconductor particles, and the particle diameter of the particles corresponds to the primary particle diameter of utilized semiconductor particles.

Since the semiconductor particle layer formed on a conductive layer of the conductive substrate in this manner is weak in bonding strength with a conductive support or in bonding strength among particles each other as well as in mechanical strength, the calcination treatment of the aforesaid semiconductor particle aggregate film is preferably performed to increase mechanical strength and to make calcinated film firmly adhered on the substrate.

In the present invention, the semiconductor layer may have any structure, however, preferable is a layer having a porous structure (having voids, also referred to as a porous layer).

The porosity of the semiconductor layer of the present invention is preferably not more than 10% by volume, more preferably not more than 8% by volume and specifically preferably 0.01-5% by volume. A porosity of a semiconductor film means a porosity penetrating in the thickness direction of a dielectric substance, and can be measured by use of an apparatus available on the market such as a mercury porosimeter (Shimazu Porelyzer 9220).

The layer thickness of the semiconductor layer containing a calcinated layer having a porous structure is preferably at least not less than 10 nm and more preferably 100-10,000 nm.

At the time of a calcination treatment, the calcination temperature is preferably not higher than 1,000° C., more preferably 200-800° C. and specifically preferably 300-800° C., in order to suitably control the actual surface area of the calcinated layer and to prepare the calcinated layer having the above-described porosity.

The ratio of an actual surface area to an apparent surface area can be controlled by, for example, the particle diameter of semiconductor particles and the calcination temperature. After the calcination treatment, for the purpose of increasing a surface area, and increasing the purity of titanium oxide in the vicinity of semiconductor particles in order to increase electron injection efficiency from compound to semiconductor particles, a chemical plating treatment may be performed utilizing a titanium tetrachloride aqueous solution or an electrochemical plating treatment may be performed utilizing a titanium trichloride aqueous solution.

(Sensitization Treatment of Metal Compound Semiconductor)

A sensitization treatment of the metal compound semiconductor is performed by dissolving compound in a suitable solvent and immersing a substrate, comprising the aforesaid semiconductor having been calcinated, in the solution. At this time, the substrate formed by calcinating a semiconductor layer (also referred to as semiconductor film) is preferably subjected to a evacuation treatment or a heating treatment to eliminate air bubbles in the film so that sensitizing compound of the present invention can deeply enter into the interior of a semiconductor layer (semiconductor film). Accordingly, it is specifically preferable when the semiconductor layer (semiconductor film) is a porous film.

A solvent utilized to dissolve the sensitizing compound of the present invention is not specifically limited as far as it dissolves said compound and does not dissolve nor react with the semiconductor. However, it is preferable that the solvent is degassed and purified by distillation in advance to prevent moisture and air dissolved in the solvent from entering into semiconductor film resulting in prevention of a sensitization treatment such as by adsorption of the aforesaid compound.

For dissolution of the aforesaid compound, examples of a preferably utilized solvent include: alcohol solvents such as methanol, ethanol and n-propanol; ketone solvents such as acetone and methylethyl ketone; ether solvents such as diethyl ether, diisopropyl ether, tetrahydrofuran and 1,4-dioxane; and a hydrocarbon halogenide solvent such as methylene chloride and 1,1,2-trichloroethane. Of these, specifically preferable are methanol, ethanol, acetone, methylethyl ketone, tetrahydrofuran and methylene chloride.

(Temperature and Duration of Sensitization Treatment)

In order to sufficiently promote the adsorption of the aforesaid compound by deeply penetrating into a semiconductor layer (semiconductor film) to sufficiently sensitize the semiconductor, and also to avoid the disturbance of the adsorption of the compound due to the decomposition product of the compound in the solution, the duration to immerse a substrate containing a calcinated metal compound semiconductor in a solution containing a sensitizing compound of the present invention is preferably 3-48 hours and more preferably 4-24 hours, under a condition of 25° C. This effect is particularly significant when a semiconductor layer is a porous layer. The above duration of immersion is a value under a condition of 25° C. and it is not the case when the temperature condition is varied.

In the case of immersion, a solution containing the sensitizing compound of the present invention may be used by heating the solution within a temperature range where it does not boil, provided that the compound does not decomposes. A preferable temperature range is 10-100° C. and more preferably 25-80° C.; however, it is not the case when a solvent boils in the aforesaid temperature range, as described above.

<<Electrolyte>>

The electrolyte utilized in the present invention will now be explained.

In the photoelectric conversion element of the present invention, an electrolyte is filled between the pair of electrodes to form an electrolyte layer. As an electrolyte, a redox electrolyte is preferably used. Examples of an electrolyte includes: a $I^-/I_3^-$ type, a $Br^-/Br_3^-$ type and a quinone/hydroquinone type. These redox electrolytes can be prepared by a method conventionally well known in the art, and, for example, an electrolyte of $I^-/I_3^-$ type can be prepared by mixing iodine and an ammonium salt of iodine. An electrolyte layer is constituted of a dispersion of these redox electrolytes. The dispersion is referred to as (i) a liquid electrolyte when it is a liquid, (ii) a solid polymer electrolyte when an electrolyte is dispersed in polymer which is solid at ordinary temperature, and (iii) a gel electrolyte when an electrolyte is dispersed in a gel form substance. In the case that a liquid electrolyte is utilized as an electrolyte layer, an electrochemically inert solvent is used, of which examples include: acetonitrile, propylene carbonate and ethylene carbonate. Examples of a solid electrolyte are disclosed in JP-A 2001-160427, and examples of a gel electrolyte are shown in "Surface Science", vol. 21, No. 5, pp. 288-293.

<<Counter Electrode>>

The counter electrode utilized in the present invention will now be explained.

As a counter electrode, those having conductivity are applicable and any conductive material is usable, however, preferable is a material having a catalytic function to promote the oxidation reaction of such as $I_3-$ ions and the reduction reaction of other redox ions at a sufficient rate. Examples of such a material include: a platinum electrode, a conductive material having a plated or evaporated platinum layer on the surface, rhodium metal, ruthenium metal, ruthenium oxide and carbon.

<<Solar Cell>>

The solar cell of the present invention will now be explained.

In the solar cell of the present invention, optimization of the design and the circuit design against sunlight are carried out, as an embodiment of a photoelectric conversion element of the present invention, to provide a structure by which optimum photoelectric conversion is obtained when sunlight is utilized as a light source. That is, a structure in which a compound sensitized metal compound semiconductor is capable of being irradiated with sunlight. At the time of fabricating a solar cell of the present invention, it is preferable that the aforesaid metal compound semiconductor, electrolyte layer and counter electrode are stored in a sealed case or the whole members are sealed by using a resin.

When the solar cell of the present invention is irradiated with sunlight or electromagnetic waves equivalent to sunlight, the compound adsorbed on a metal compound semiconductor absorbs irradiated sunlight or electromagnetic waves to be excited. An electron generated by the excitation is transferred to the metal compound semiconductor and successively to the conductive support. Then the electron is transferred through an external circuit to the counter electrode where the electron reduces the redox electrolyte in the electrolyte layer. On the other hand, the compound of the present invention, which has given the electron to the semiconductor, is in an oxidized state, however, returns to the original reduced state by receiving an electron from the counter electrode via the redox electrolyte in the electrolyte layer. Simultaneously, the redox electrolyte in a charge transfer layer returns again to an oxidized state capable of being reduced with an electron supplied from the counter electrode. The electrons flow in this manner, and the solar cell utilizing the photoelectric conversion element of the present invention can be thus constituted.

EXAMPLES

In the following, the present invention will be explained referring to examples, however the present invention is not limited thereto.

Preparation of Photoelectric Conversion Elements 1-13

Each of the compounds listed in Table 1 was dissolved in ethanol to prepare a solution of $3\times10^{-4}$ M (mole/liter). The FTO coated glass substrate on which titanium oxide having an average diameter of 18 nm had been applied and calcinated was immersed in the above solution for 16 hours at room temperature to perform an adsorption treatment of the compound, followed by drying, whereby a photo-electrode was prepared. As an electrolyte layer, a 3-methylpropionyitrile solution containing 0.4 M of lithium iodide, 0.05 M of iodine and 0.5 M of 4-(t-butyl)pyridine was utilized. A platinum plate was utilized as a counter electrode, and each photoelectric conversion element was prepared by assembling together with the photo-electrode and the liquid electrolyte, which had been prepared in advance, by use of a cramp cell (refer to FIG. 1).

Further, after each of the abovementioned photo-electrodes was exposed to an ozone atmosphere of 13 ppm for 20 minutes, photoelectric conversion elements were fabricated to observe the variation in the power generation property before and after the exposure to ozone.

In photoelectric conversion elements 1 and 2, comparative compound 1 (Ru complex: dithiocyanate-bis(2,2'-bipyridyl-4,4'-dicarboxylate)ruthenium) and comparative compound 2 were used, respectively.

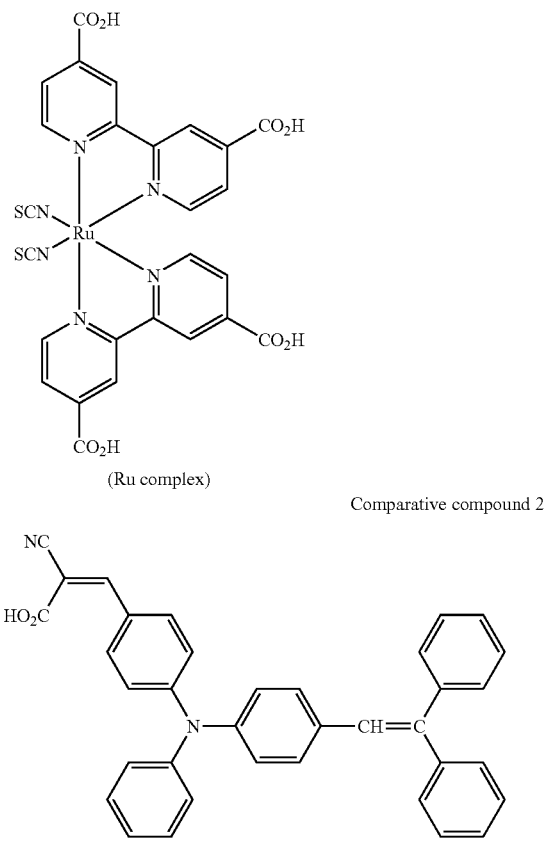

Evaluation tests were carried out using a solar simulator (Product name: WXS-85-H type, produced by WACOM ELECTRIC Co., Ltd.) under irradiation of light from a xenon lamp through an AM filter (AM-1.5) at an intensity of 100 mW/cm$^2$. With respect to each photoelectric conversion element, a current-voltage characteristic at room temperature was measured by use of an I-V tester, whereby a short circuit current (Isc) and an open circuit voltage (Voc) were determined.

The results were shown below.

Each of photoelectric conversion elements 3-13 of the present invention showed notably smaller decrease in open circuit voltage (Voc) and in short circuit current (Isc) after the exposure to ozone, compared to the decrease observed for photoelectric conversion element 1 (Comparative compound 1: Ru complex), showing that the sensitizing compound of the present invention exhibits higher durability compared to that of the conventional compound.

In photoelectric conversion element 2 (carrying sensitizing compound 2), the photoelectric conversion property largely degraded since the sensitizing compound was not sufficiently adsorbed on the titanium oxide electrode.

Furthermore, the whole body of each photoelectric conversion element was sealed with a resin and load line was attached to fabricate a solar cell. As the results of the evaluation tests carried out in the same manner as above on each solar cell, it was found that the each solar cell of the present invention exhibited superior property for a long period of time.

Preparation of Photoelectric Conversion Element 14
(Comparative)

On a FTO electrode, an alkoxy titanium solution (TA-25/IPA dilution produced by MATSUMOTO KOSHO Co., Ltd.) was applied by a spin-coating method, followed by leaving for 30 minutes at an ambient temperature and subsequently calcinating at 450° C. for 30 minutes. Thus, a short circuit inhibiting layer was formed. Then, a commercially available titanium paste was (diameter of 18 nm) was applied on the above substrate by a doctor blade method, followed by heat drying for 10 minutes at 60° C. and subsequently calcinating at 500° C. for 30 minutes. Thus, a substrate having a semiconductor electrode which was a titanium oxide thin film of which thickness was 5 μm.

Comparative compound 1 was dissolved in ethanol to prepare a solution of 3×10$^{-4}$ M (mole/liter). The above substrate having a semiconductor electrode was immersed in this solution for 16 hours at room temperature to perform an adsorption treatment of the compound, followed by washing with chloroform and vacuum drying, whereby a photoelectric conversion electrode was prepared.

Next, 0.17 M of the following compound (spiro-MeO TAD) as a hole transport agent, 0.33 mM of N(PhBr)$_3$SbCl$_6$ as a hole doping agent) and 15 mM of Li[(CF$_3$SO$_2$)$_2$N] were dissolved in toluene. This solution was spin-coated on the above photoelectric conversion electrode adsorbed with the compound to form a hole transport layer. Further, gold was vacuum evaporated on the hole transport layer to form a counter electrode. Thus, a photoelectric conversion element 14 was prepared.

TABLE 1

| Photoelectric conversion element | Sensitizing compound | Before exposure to ozone Voc | Before exposure to ozone Isc | After exposure to ozone Voc | After exposure to ozone Isc | Degradation ratio Voc | Degradation ratio Isc | Remarks |
|---|---|---|---|---|---|---|---|---|
| 1 | Comparative compound 1 | 695 | 4.2 | 310 | 0.18 | 0.55 | 0.96 | Comparative |
| 2 | Comparative compound 2 | 443 | 0.6 | 302 | 0.1 | 0.32 | 0.83 | Comparative |
| 3 | I-1 | 692 | 2.8 | 605 | 0.9 | 0.13 | 0.68 | Inventive |
| 4 | I-2 | 681 | 3.3 | 616 | 1.8 | 0.10 | 0.45 | Inventive |
| 5 | I-3 | 688 | 3.7 | 625 | 2.2 | 0.09 | 0.41 | Inventive |
| 6 | I-4 | 702 | 2.5 | 611 | 0.7 | 0.13 | 0.72 | Inventive |
| 7 | I-9 | 669 | 2.3 | 603 | 0.6 | 0.10 | 0.74 | Inventive |
| 8 | I-13 | 680 | 3.2 | 607 | 1.1 | 0.11 | 0.66 | Inventive |
| 9 | I-15 | 673 | 3.1 | 601 | 1.1 | 0.11 | 0.65 | Inventive |
| 10 | I-19 | 656 | 2.6 | 607 | 0.9 | 0.07 | 0.65 | Inventive |
| 11 | II-2 | 704 | 3.8 | 641 | 1.4 | 0.09 | 0.63 | Inventive |
| 12 | II-3 | 678 | 2.2 | 600 | 0.7 | 0.12 | 0.68 | Inventive |
| 13 | II-6 | 668 | 3.9 | 612 | 2.6 | 0.08 | 0.33 | Inventive |

Degradation ratio = (Before exposure to ozone − After exposure to ozone)/(Before exposure to ozone)

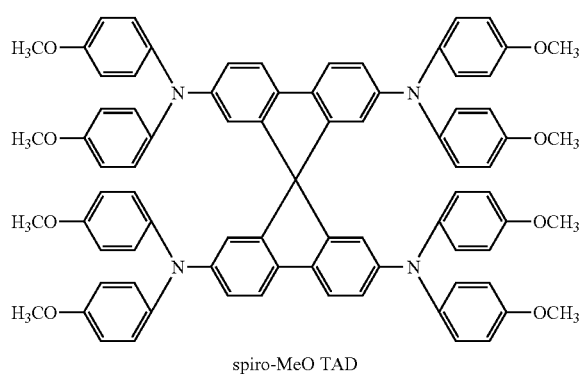

spiro-MeO TAD

Preparation of Photoelectric Conversion Elements 15-17

Photoelectric conversion elements 15-17 were prepared in the same manner as photoelectric conversion element 14 (Comparative) except that comparative compound 1 was respectively changed to the compounds listed in Table 2.

Photoelectric conversion elements 14-17 were evaluated in the same manner as above.

TABLE 2

| Photoelectric conversion element | Sensitizing compound | Before exposure to ozone | | After exposure to ozone | | Degradation ratio | | Remarks |
|---|---|---|---|---|---|---|---|---|
| | | Voc | Isc | Voc | Isc | Voc | Isc | |
| 14 | Comparative compound 1 | 638 | 1.6 | 157 | 0.01 | 0.75 | 0.99 | Comparative |
| 15 | Comparative compound 2 | 378 | 0.2 | 234 | 0.01 | 0.38 | 0.95 | Comparative |
| 16 | I-1 | 668 | 1.1 | 547 | 0.4 | 0.18 | 0.64 | Inventive |
| 17 | II-2 | 644 | 1.4 | 533 | 0.5 | 0.17 | 0.64 | Inventive |

Degradation ratio = (Before exposure to ozone − After exposure to ozone)/(Before exposure to ozone)

Each of the solar cells of the present invention showed notably smaller decreases in open circuit voltage (Voc) and in short circuit current (Isc) after the exposure to ozone, compared to the decreases observed for the comparative solar cells, showing that the sensitizing compound of the present invention exhibits higher durability compared to that of the conventional compound.

What is claimed is:

1. A photoelectric conversion element comprising a pair of electrodes containing therebetween a compound represented by Formula (1) or Formula (2):

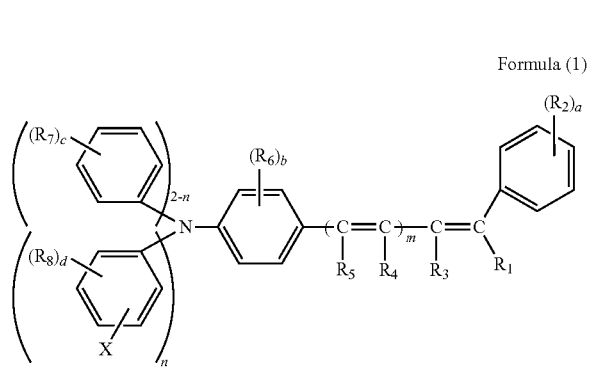

Formula (1)

wherein
$R_1$, $R_3$, $R_4$, and $R_5$ each represent a hydrogen atom, a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group or a substituted or unsubstituted heterocycle group;
$R_2$ represent a halogen atom, a substituted or unsubstituted alkyl group, a substituted or unsubstituted alkoxy group, a substituted or unsubstituted aryl group, a substituted or unsubstituted alkenyl group, or a substituted or unsubstituted amino group;
$R_6$, $R_7$ and $R_8$ each represent a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group, or a substituted or unsubstituted heterocycle group;
$R_1$ may be combined with a neighboring group to form a ring;
$R_7$ and $R_8$ may be combined to form a ring;
X represents an organic group having an acid group;
a and c each represent an integer of 0 to 5;
b and d each represent an integer of 0 to 4;
m represents an integer of 0 to 4;
n represents an integer of 1 or 2;
when $R_1$ is a phenyl group, (a+b+c+d) is 1 or more, or one of $R_3$, $R_4$ and $R_5$ is a group other than a hydrogen atom; and
when a plurality of $R_1$, $R_2$, $R_3$, $R_4$, $R_5$, $R_6$, $R_7$ or $R_8$ are contained, the plurality of $R_1$, $R_2$, $R_3$, $R_4$, $R_5$, $R_6$, $R_7$ or $R_8$ may be the same or different,

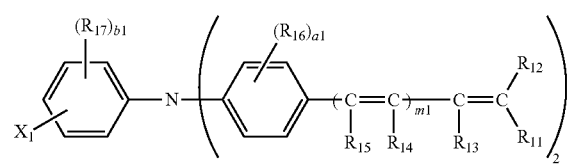

Formula (2)

wherein
$R_{11}$ to $R_{17}$ each represent a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group or a substituted or unsubstituted heterocycle group;
$R_{11}$ and $R_{12}$ may be combined to form a ring;

$X_1$ represents an organic group having an acid group;

A1, b1 and m1 each represent an integer of 0 to 4; and when a plurality of $R_{11}$, $R_{12}$, $R_{13}$, $R_{14}$, $R_{15}$, $R_{16}$, or $R_{17}$ are contained, the plurality of $R_{11}$, $R_{12}$, $R_{13}$, $R_{14}$, $R_{15}$, $R_{16}$, or $R_{17}$ may be the same or different.

2. The photoelectric conversion element of claim 1, wherein the compound is represented by Formula (1).

3. The photoelectric conversion element of claim 2 comprising a semiconductor layer and an electrolyte layer between the pair of electrodes, wherein the semiconductor layer contains a metal compound semiconductor carrying the compound represented by Formula (1).

4. The photoelectric conversion element of claim 3, wherein the metal compound semiconductor is titanium oxide.

5. The photoelectric conversion element of claim 3, wherein the metal compound semiconductor is subjected to a surface treatment using an organic base.

6. The photoelectric conversion element of claim 3, wherein a thickness of the semiconductor layer is 100 to 10000 nm.

7. The photoelectric conversion element of claim 3, wherein a porosity of the semiconductor layer is not more than 10% by volume.

8. The photoelectric conversion element of claim 3, wherein a content of the compound represented by Formula (1) per 1 $m^2$ of the semiconductor layer is 0.01-100 mmol.

9. The photoelectric conversion element of claim 3, wherein a n-butyronitrile solution containing lithium iodide, iodine and 4-(t-butyl)pyridine is used in the electrolyte layer.

10. A photoelectric conversion element comprising a pair of electrodes containing therebetween a compound represented by Formula (2)

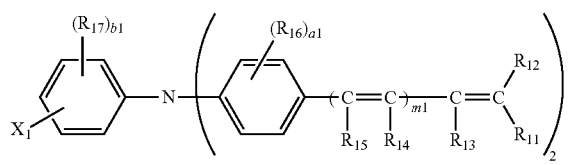

Formula (2)

wherein $R_{11}$ to $R_{17}$ each represent a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group or a substituted or unsubstituted heterocycle group;

$R_{11}$ and $R_{12}$ may be combined to form a ring;

$X_1$ represents an organic group having an acid group;

A1, b1 and m1 each represent an integer of 0 to 4; and when a plurality of $R_{11}$, $R_{12}$, $R_{13}$, $R_{14}$, $R_{15}$, $R_{16}$, or $R_{17}$ are contained, the plurality of $R_{11}$, $R_{12}$, $R_{13}$, $R_{14}$, $R_{15}$, $R_{16}$, or $R_{17}$ may be the same or different.

11. The photoelectric conversion element of claim 10 comprising a semiconductor layer and an electrolyte layer between the pair of electrodes, wherein the semiconductor layer contains a metal compound semiconductor carrying the compound represented by Formula (2).

12. The photoelectric conversion element of claim 11, wherein the metal compound semiconductor is titanium oxide.

13. The photoelectric conversion element of claim 11, wherein the metal compound semiconductor is subjected to a surface treatment using an organic base.

14. The photoelectric conversion element of claim 11, wherein a thickness of the semiconductor layer is 100 to 10000 nm.

15. The photoelectric conversion element of claim 11, wherein a porosity of the semiconductor layer is not more than 10% by volume.

16. The photoelectric conversion element of claim 11, wherein a content of the compound represented by Formula (2) 1 $m^2$ of the semiconductor layer is 0.01-100 mmol.

17. The photoelectric conversion element of claim 11, wherein a n-butyronitrile solution containing lithium iodide, iodine and 4-(t-butyl)pyridine is used in the electrolyte layer.

18. The photoelectric conversion element of claim 1, wherein at least two compounds having different absorption wavelengths are utilized.

19. A solar cell comprising the photoelectric conversion element of claim 1.

* * * * *